United States Patent
Ehira et al.

(10) Patent No.: US 9,212,418 B2
(45) Date of Patent: *Dec. 15, 2015

(54) AL-NI-LA SYSTEM AL-BASED ALLOY SPUTTERING TARGET

(75) Inventors: Masaya Ehira, Takasago (JP); Katsutoshi Takagi, Takasago (JP); Toshihiro Kugimiya, Takasago (JP); Yoichiro Yoneda, Takasago (JP); Hiroshi Gotou, Kobe (JP)

(73) Assignees: Kobe Steel, Ltd., Kobe-shi (JP); KOBELCO RESEARCH INSTITUTE, INC., Kobe-shi (JP)

( * ) Notice: Subject to any disclaimer, the term of this patent is extended or adjusted under 35 U.S.C. 154(b) by 2387 days.

This patent is subject to a terminal disclaimer.

(21) Appl. No.: 11/931,197

(22) Filed: Oct. 31, 2007

(65) Prior Publication Data

US 2008/0121522 A1 May 29, 2008

(30) Foreign Application Priority Data

Nov. 20, 2006 (JP) .................................. 2006-313506

(51) Int. Cl.
*C23C 14/34* (2006.01)
*C23C 4/08* (2006.01)
*C23C 4/12* (2006.01)
(Continued)

(52) U.S. Cl.
CPC .............. *C23C 14/3414* (2013.01); *C22C 21/00* (2013.01); *C23C 4/08* (2013.01); *C23C 4/121* (2013.01); *H01J 37/3426* (2013.01); *H01J 37/3429* (2013.01); *B22F 3/115* (2013.01); *B22F 3/15* (2013.01); *B22F 3/17* (2013.01);
(Continued)

(58) Field of Classification Search
CPC ...... C23C 14/3414; C23C 4/121; C23C 4/08; C22C 1/0491; C22C 21/00; B22F 9/082; B22F 3/115; B22F 3/15; B22F 3/17; B22F 3/18; B22F 2998/10
USPC .......................... 204/192.13, 192.15, 298.13
See application file for complete search history.

(56) References Cited

U.S. PATENT DOCUMENTS 4,814,053 A * 3/1989 Shimokawato .......... 204/192.15
5,514,909 A 5/1996 Yamamoto et al.
(Continued)

FOREIGN PATENT DOCUMENTS

CN          1712551 A      12/2005
EP        1 700 928 A1      9/2006
(Continued)

OTHER PUBLICATIONS

JP 2001053024 (Derwent Abstract).*
(Continued)

*Primary Examiner* — Michael Band
(74) *Attorney, Agent, or Firm* — Oblon, McClelland, Maier & Neustadt, L.L.P.

(57) ABSTRACT

The invention relates to an Al—Ni—La system Al-based alloy sputtering target where a total area of an Al—Ni system intermetallic compound having an average particle diameter of 0.3 μm to 3 μm with respect to a total area of the entire Al—Ni system intermetallic compound is 70% or more in terms of an area fraction, and a total area of an Al—La system intermetallic compound having an average particle diameter of 0.2 μm to 2 μm with respect to a total area of the entire Al—La system intermetallic compound is 70% or more in terms of an area fraction.

16 Claims, 10 Drawing Sheets

(51) Int. Cl.
  *C22C 21/00* (2006.01)
  *B22F 9/08* (2006.01)
  *B22F 3/115* (2006.01)
  *B22F 3/15* (2006.01)
  *B22F 3/17* (2006.01)
  *B22F 3/18* (2006.01)
  *H01J 37/34* (2006.01)

(52) U.S. Cl.
  CPC . *B22F 3/18* (2013.01); *B22F 9/082* (2013.01); *B22F 2998/10* (2013.01)

(56) References Cited

U.S. PATENT DOCUMENTS

| | | | |
|---|---|---|---|
| 6,033,542 | A | 3/2000 | Yamamoto et al. |
| 6,096,438 | A | 8/2000 | Takagi et al. |
| 6,218,206 | B1 | 4/2001 | Inoue et al. |
| 6,252,247 | B1 | 6/2001 | Sakata et al. |
| 6,929,726 | B2 * | 8/2005 | Watanabe et al. ........ 204/298.13 |
| 7,017,382 | B2 * | 3/2006 | Segal et al. ...................... 72/256 |
| 7,098,539 | B2 | 8/2006 | Gotoh et al. |
| 7,154,180 | B2 | 12/2006 | Gotoh et al. |
| 7,262,085 | B2 | 8/2007 | Gotoh et al. |
| 7,365,810 | B2 | 4/2008 | Gotoh et al. |
| 7,411,298 | B2 | 8/2008 | Kawakami et al. |
| 2003/0047812 | A1 | 3/2003 | Hagihara et al. |
| 2003/0052000 | A1 * | 3/2003 | Segal et al. .............. 204/298.13 |
| 2004/0126608 | A1 | 7/2004 | Gotoh et al. |
| 2005/0277002 | A1 | 12/2005 | Ziani et al. |
| 2006/0091792 | A1 | 5/2006 | Kugimiya et al. |
| 2006/0180250 | A1 | 8/2006 | Kugimiya et al. |
| 2006/0181198 | A1 | 8/2006 | Gotoh et al. |
| 2006/0237849 | A1 | 10/2006 | Gotoh et al. |
| 2006/0275618 | A1 | 12/2006 | Kugimiya et al. |
| 2007/0040173 | A1 | 2/2007 | Kugimiya et al. |
| 2007/0278497 | A1 | 12/2007 | Kawakami et al. |
| 2008/0081532 | A1 | 4/2008 | Okuno |

FOREIGN PATENT DOCUMENTS

| | | | |
|---|---|---|---|
| JP | 07045555 A | * | 2/1995 |
| JP | 10-147860 | | 6/1998 |
| JP | 10-199830 | | 7/1998 |
| JP | 11-283934 | | 10/1999 |
| JP | 11-284195 | | 10/1999 |
| JP | 11-293454 | | 10/1999 |
| JP | 11-337976 | | 12/1999 |
| JP | 2001053024 A | * | 2/2001 |
| JP | 2001-279433 | | 10/2001 |
| JP | 2003-273109 | | 9/2003 |
| JP | 2004-214606 | | 7/2004 |
| JP | 2006-225687 | | 8/2006 |

OTHER PUBLICATIONS

JP 2001053024 (Japanese Abstract).*
Taiwanese Office Action dated Aug. 15, 2011 as received in the corresponding Taiwanese Patent Application No. 096142875 w/English Translation.

* cited by examiner

FIG. 1A

SEM REFLECTION ELECTRON IMAGE

FIG. 1B

IMAGE OF Al-La SYSTEM
INTERMETALLIC COMPOUND

FIG. 1C

IMAGE OF Al-Ni SYSTEM
INTERMETALLIC COMPOUND

FIG. 2A

SEM PHOTOGRAPH

AL-NI-LA SYSTEM AL-BASED ALLOY SPUTTERING TARGET

FIELD OF THE INVENTION

The present invention relates to an Al—Ni—La system Al-based alloy sputtering target containing Ni and La and a process for producing the same. In more detail, it relates to an Al—Ni—La system Al-based alloy sputtering target that can, when a thin film is deposited by the use of a sputtering target, reduce the number of initial splashes generated at an initial stage of sputtering, and a process for producing the same.

BACKGROUND OF THE INVENTION

An Al-based alloy, being low in the electrical resistivity and easy to process, is widely used in a field of flat panel displays (FPD) such as liquid crystal displays (LCD), plasma display panels (PDP), electroluminescent displays (ELD) and field emission displays (FED) and is used as materials for interconnection films, electrode films and reflective electrode films.

For instance, an active matrix type liquid crystal display includes a thin film transistor (TFT) that is a switching element, a pixel electrode made of a conductive oxide film and a TFT substrate having an interconnection containing a scanning line and a signal line and the scanning line, the signal line being electrically connected to the pixel electrode. As an interconnection material that constitutes the scanning line and signal line, generally, thin films of a pure Al or an Al—Nd alloy are used. However, when the thin films are directly connected to the pixel electrode, insulating aluminum oxide is formed at an interface to increase the electrical resistance. Accordingly, so far, a barrier metal layer made of a refractory metal such as Mo, Cr, Ti or W has been disposed between the Al interconnection material and the pixel electrode to reduce the electrical resistance.

However, in a method of interposing a barrier metal layer such as mentioned above, there is a problem in that a production process becomes troublesome to be high in the production cost.

In this connection, there has been proposed, as a technology that, without interposing a barrier metal layer, enables to directly connect an electroconductive oxide film that constitutes a pixel electrode and an interconnection material (direct contact technology), a method in which as an interconnection material a film of an Al—Ni alloy or an Al—Ni alloy further containing a rare earth element such as Nd or Y is used (see, JP-A-2004-214606). When Al—Ni alloy is used, at an interface, an electroconductive Ni-containing precipitates are formed to suppress insulating aluminum oxide from generating; accordingly, the electrical resistance can be suppressed low. Furthermore, when Al—Ni-rare earth element alloy is used, the heat resistance can be further improved.

Now, when an Al-based alloy thin film is formed, in general, a sputtering method that uses a sputtering target has been adopted. According to a sputtering method, plasma discharge is generated between a substrate and a sputtering target (target material) constituted of a thin film material, a gas ionized by the plasma discharge is brought into collision with the target material to knock out atoms of the target material to deposit on the substrate to produce a thin film. The sputtering method, different from a vacuum deposition method and an arc ion plating method (AIP), has an advantage in that a thin film having a composition same as that of the target material can be formed. In particular, an Al-based alloy thin film deposited by use of the sputtering method can dissolve an alloy element such as Nd that cannot be dissolved in an equilibrium state and thereby can exert excellent performance as a thin film; accordingly, the sputtering method is an industrially effective thin film producing method and a development of a sputtering target material that is a raw material thereof has been forwarded.

Recently, in order to cope with the productivity enlargement of FPDs, a depositing rate at the sputtering tends to be increased more than ever. In order to increase the depositing rate, the sputtering power can be most conveniently increased. However, when the sputtering power is increased, sputtering defects such as splashes (fine melt particles) are caused to generate defects in the interconnection film; accordingly, harmful effects such as deteriorating the yield and operation performance of the FPDs are caused.

In this connection, in order to inhibit the splashes from occurring, for instance, methods described in JP-A-10-147860, JP-A-10-199830, JP-A-11-293454 or JP-A-2001-279433 has been proposed. Among these, in JP-A-10-147860, JP-A-10-199830 and JP-A-11-293454 that are based on the viewpoint in that the splash is caused owing to fine voids in a target material texture, a dispersion state of particles of a compound of Al and a rare earth element in an Al matrix is controlled (JP-A-10-147860), a dispersion state of a compound of Al and a transition metal element in an Al matrix is controlled (JP-A-10-199830) or a dispersion state of an intermetallic compound between an additive element and Al in a target is controlled (JP-A-11-293454) to inhibit the splash from occurring. Furthermore, JP-A-2001-279433 discloses a technology in which, in order to reduce the arching (irregular discharge) that is a cause of the splashes, the hardness of a sputtering surface is controlled, followed by applying finish working to inhibit surface defects due to the mechanical working from occurring.

On the other hand, a technology that inhibits a target from warping due to heating at the production of mainly a large target has been disclosed (see, JP-A-2006-225687). In JP-A-2006-225687, it is disclosed that, with an Al—Ni-rare earth element alloy sputtering target as an object, when more than a predetermined number of compounds having an aspect ratio of 2.5 or more and a circle equivalent diameter of 0.2 μm or more are present in a cross section vertical to a target plane, the target can be inhibited from deforming.

As mentioned above, although various technologies for reducing the generation of the splashes to reduce the sputtering defects have been proposed, a further improvement has been demanded. In particular, the initial splashes occurring in an initial stage of the sputtering deteriorate the yield of FPDs and thereby cause a serious problem. However, the splash inhibition technologies disclosed in JP-A-10-147860, JP-A-10-199830, JP-A-11-293454 or JP-A-2001-279433 cannot sufficiently effectively inhibit the initial splashes from occurring. Furthermore, in an Al-based alloy sputtering target that is used to form a thin film of, among Al-based alloys, an Al—Ni-rare earth element alloy useful as a wiring material capable of directly connectable with an electroconductive oxide film that constitutes a pixel electrode, in particular, an Al—Ni—La system Al-based alloy, a technology that can overcome the above-mentioned problems has not yet been proposed.

SUMMARY OF THE INVENTION

The invention was carried out in view of the above-mentioned circumstances and intends to provide a technology that can reduce the splashes, in particular, the initial splashes generated when a Ni and La-containing Al—Ni—La system Al-based alloy sputtering target is used to deposit a film.

BRIEF DESCRIPTION OF THE DRAWINGS

FIG. 2A is a SEM reflection electron image of example No. 5 (inventive example) of Table 1, FIG. 2B being a diagram showing a result of an EDX analysis of a composition of 1 (matrix) in FIG. 2A, FIG. 2C being a diagram showing a result of an EDX analysis of a composition of 2 (white compound) in FIG. 2A, and FIG. 2D being a diagram showing a result of an EDX analysis of a composition of 3 (gray compound) in FIG. 2A.

DESCRIPTION OF THE REFERENCE NUMERALS AND SIGNS

1 induction melting furnace
2 Al-based alloy melt
3a and 3b gas atomizer
4a and 4b gas hole of bobbin
5 collector
6 nozzle
6a and 6b center axis of gas atomizing nozzle
A spray axis
L spray distance
α gas atomizer outlet angle
β collector angle

DETAILED DESCRIPTION OF THE INVENTION

Namely, the present invention relates to the following items 1 to 3.

1. An Al—Ni—La system Al-based alloy sputtering target comprising Ni and La, wherein, when a section from (¼)t to (¾)t (t: thickness) in a cross section vertical to a plane of the sputtering target is observed with a scanning electron microscope at a magnification of 2000 times,
    (1) a total area of an Al—Ni system intermetallic compound having an average particle diameter of 0.3 µm to 3 µm with respect to a total area of the entire Al—Ni system intermetallic compound is 70% or more in terms of an area fraction, the Al—Ni system intermetallic compound being mainly composed of Al and Ni; and
    (2) a total area of an Al—La system intermetallic compound having an average particle diameter of 0.2 µm to 2 µm with respect to a total area of the entire Al—La system intermetallic compound is 70% or more in terms of an area fraction, the Al—La system intermetallic compound being mainly composed of Al and La.

2. The Al—Ni—La system Al-based alloy sputtering target according to item 1, which comprises:
    Ni in an amount of 0.05 atomic percent to 5 atomic percent; and
    La in an amount of 0.10 atomic percent to 1 atomic percent.

3. A process for producing an Al—Ni—La system Al-based alloy sputtering target containing Ni and La, said process comprising:
    preparing an Al—Ni—La system Al-based alloy containing Ni in an amount of 0.05 atomic percent to 5 atomic percent, and La in an amount of 0.10 atomic percent to 1 atomic percent; then
    melting said Al-based alloy at a temperature of 800 to 950° C. to obtain a melt of the Al—Ni—La system Al-based alloy; then
    gas atomizing the melt of said Al-based alloy at a gas/metal ratio of 6 $Nm^3$/kg or more to miniaturize said Al-based alloy; then
    depositing said miniaturized Al-based alloy on a collector at a spray distance of 900 to 1200 mm to obtain a preform; then
    densifying said Al-based alloy preform by means of a densifying means to obtain a dense body; and then
    subjecting the dense body to a plastic working.

According to the Al—Ni—La system Al-based alloy sputtering target of the invention, as mentioned above, particle size distributions of intermetallic compounds (an Al—Ni system intermetallic compound mainly composed of Al and Ni and an Al—La system intermetallic compound mainly composed of Al and La) present in the sputtering target are appropriately controlled; accordingly, the splashes, in particular, the initial splashes can be inhibited from occurring and thereby the sputtering defects can be effectively suppressed.

The inventors have made intensive studies to provide an Al—Ni—La system Al-based alloy sputtering target that can reduce the splashes generated during the sputtering deposition, in particular, the initial splashes generated at the initial stage during the sputtering deposition. As the result, it is found that both the particle size distributions of the intermetallic compounds (an Al—Ni system intermetallic compound mainly composed of Al and Ni and an Al—La system intermetallic compound mainly composed of Al and La) contained in the sputtering target has a significant correlation with the generation of the initial splashes and, when the particle size distributions of the intermetallic compounds are appropriately controlled, an expected object can be attained, whereby the invention have been completed.

Figure 2A:
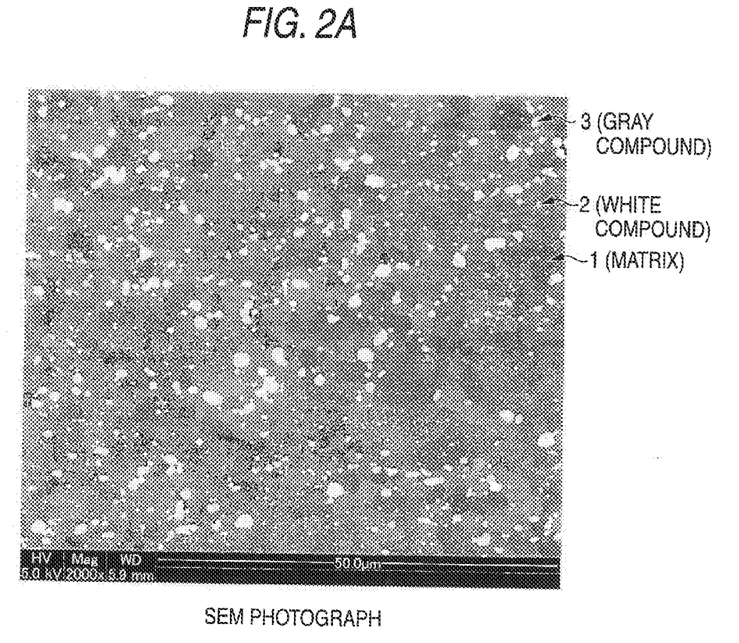
Figure 2B:
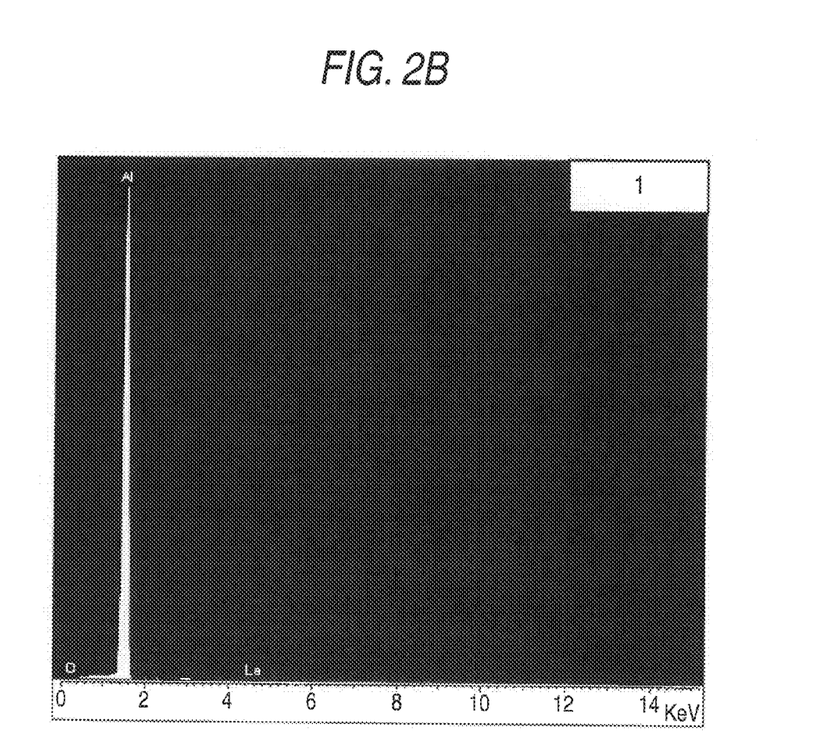
Figure 2C:
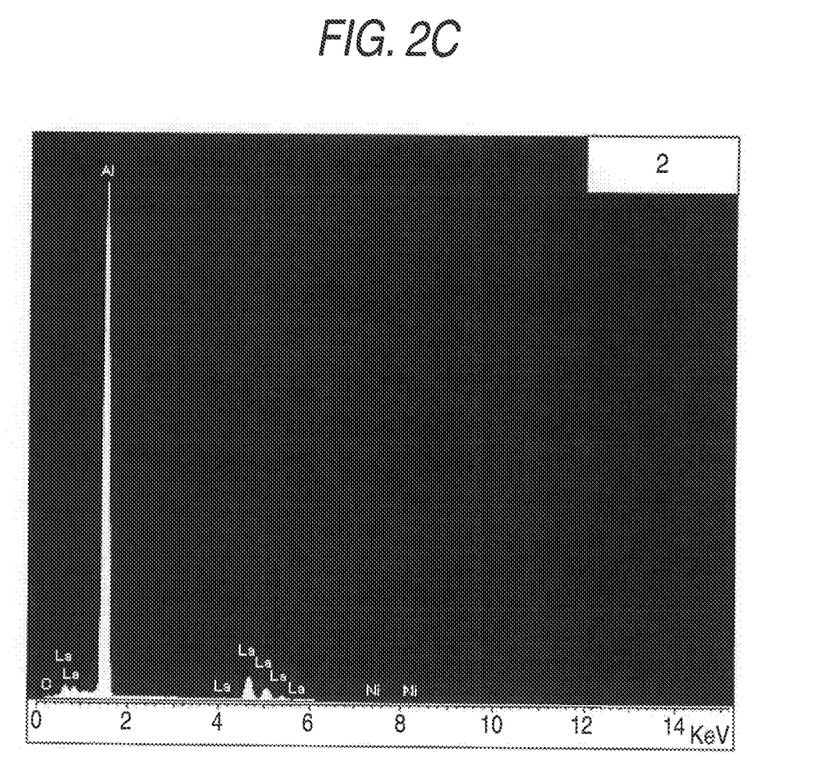
Figure 2D:
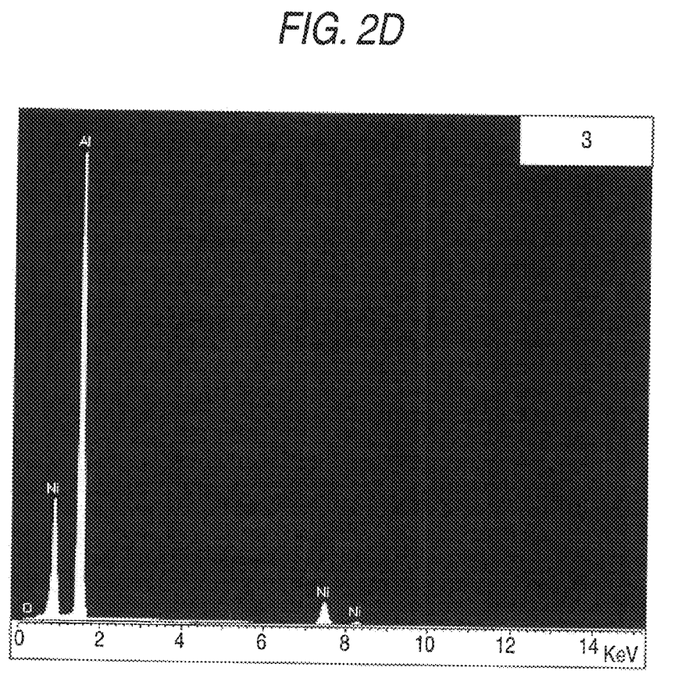

In the specification, an "Al—Ni system intermetallic compound mainly composed of Al and Ni" means one in which, when a sputtering target is analyzed according to a method detailed below, in which a SEM (Scanning Electron Microscope) provided with an EDX (Energy Dispersive X-ray Fluorescence Spectrometer) is used, peaks of Al and Ni are strongly detected and peaks of elements other than the above are not substantially detected as shown in FIG. 2C described below. As typical Al—Ni system intermetallic compounds, a binary intermetallic compound such as $Al_3Ni$ can be cited. Furthermore, an "Al—La system intermetallic compound mainly composed of Al and La" means one in which, when a sputtering target is analyzed according to a method similar to the above, peaks of Al and La are strongly detected and peaks of elements other than the above are not substantially detected as shown in FIG. 2D described below. As the typical Al—La system intermetallic compounds, a binary intermetallic compound such as $Al_{11}La_3$ can be cited.

Furthermore, in the specification, "the initial splashes can be inhibited from occurring (reduced)" means that, when the sputtering is carried out under the conditions shown in the example described below (sputtering time: 81 sec), an average value of splashes generated at this time is less than 8 spots/cm$^2$. Thus, in the invention, the sputtering time is set at 81 sec and the splashes at the initial stage of the sputtering deposition are evaluated. That is, the invention is different in the evaluation criteria from the technologies described in JP-A-10-147860, JP-A-10-199830, JP-A-11-293454 or JP-A-2001-279433 in which the generation of the initial stage splashes is not evaluated.

Firstly, an Al—Ni—La system Al-based alloy that is an object of the invention will be described.

The reason why the inventors paid attention particularly to an Al—Ni—La system Al-based alloy that contains La as a rare earth element among Al—Ni-rare earth element system Al-based alloys is particularly because, among various rare earth elements such as Nd, Y and La, La is very excellent in an improvement effect of the heat resistance.

Regarding an Al—Ni—La system Al-based alloy, even after the application of JP-A-2004-214606, direct contact-related technologies has been continuously proposed and an Al—Ni—La system Al-based alloy containing a rare earth element such as La as an interconnection material that can be directly connected with a semiconductor layer of, for instance, a thin film transistor has been disclosed (see, JP-A-2006-220633). In JP-A-2006-220633, an Al—Ni—Nd system Al-based alloy containing Nd as a rare earth element other than La is also disclosed. However, according to the subsequent studies, it was found that La can improve the heat resistance more in comparison with Nd.

Furthermore, regarding an Al—Ni-rare earth element alloy sputtering target, JP-A-2006-225687 as well discloses a technology that is targeted to a sputtering target having the above composition. However, different from the present invention, an Al—Ni—La system Al-based alloy sputtering target that contains La as a rare earth element is not substantially targeted. It goes without saying that, in JP-A-2006-225687, there is no technical idea that, in an Al—Ni—La system Al-based alloy sputtering target, in order to inhibit the initial splashes from occurring, a particle size distribution of a predetermined intermetallic compound is controlled. Furthermore, a compound (intermetallic compound) defined in JP-A-2006-225687 is a disc-like compound having an aspect ratio of 2.5 or more and a circle equivalent diameter of 0.2 μm or more and different from the invention that has a spherical compound, in terms of the shape of the intermetallic compound. Still furthermore, both are different in production processes as well. As will be detailed below, in the invention, similarly to JP-A-2006-225687, an Al-based alloy preform is preferably produced by the use of a spray forming method. However, in particular, a nozzle diameter φ is controlled to 2.5 to 10 mm and gas pressure is controlled to 0.3 to 1.5 MPa to secure a predetermined disc-like compound in JP-A-2006-225687. On the other hand, in the invention, in particular, a gas/metal ratio is controlled to 6 Nm$^3$/kg or more to secure a desired particle size distribution. In JP-A-2006-225687, the gas/metal ratio is not utterly taken into consideration; accordingly, even when a production process disclosed in JP-A-2006-225687 is adopted, an Al—Ni—La system Al-based alloy sputtering target of the invention cannot be produced.

Still furthermore, as the splash inhibition technology of an Al-based alloy sputtering target, for instance, other than JP-A-2006-225687, a technology in which a dispersion state of a compound or an intermetallic compound between Al in an Al matrix and a rare earth element is controlled is disclosed, for example in JP-A-2004-214606, JP-A-10-147860, JP-A-10-199830 and JP-A-11-293454. However, in all of these documents, an Al—Ni—La system Al-based alloy sputtering target, that is an object of the present invention, is not specifically disclosed. An Al-based alloy containing La as a rare earth element like the invention is not disclosed in any of documents disclosed in a section of background art including the above patent documents.

As will be described below, the invention has been achieved according to a novel finding that an Al—Ni—La system Al-based alloy sputtering target containing La is largely different in a shape of an intermetallic compound from an Al—Ni-rare earth element system Al-based alloy sputtering target that contains a rare earth element other than La, for instance, an Al—Ni—Nd system Al-based alloy sputtering target as described in JP-A-2006-225687. In the former Al—Ni—La system Al-based alloy sputtering target, as shown in FIGS. 2A to 2D, while a binary intermetallic compound composed of Al and Ni or Al and La is mainly present, a ternary intermetallic compound composed of Al, Ni and La is hardly present. On the contrary, in the latter Al—Ni—Nd system Al-based alloy sputtering target, a ternary intermetallic compound composed of Al, Ni and Nd is mainly present and a binary intermetallic compound composed of Al and Ni or Al and Nd is hardly present. Accordingly, the technology in the present invention can be said specialized in an Al—Ni—La system Al-based alloy sputtering target, among the Al—Ni-rare earth element system Al-based alloy sputtering targets.

The content of Ni contained in the Al-based alloy of the invention is preferably from 0.05 atomic percent to 5 atomic percent. The range is calculated based on experimental results of examples described below. When the lower limit of an amount of Ni is less than 0.05 atomic percent, an area fraction of an intermetallic compound having a particle diameter of less than 0.3 μm becomes larger. Accordingly, when a surface of a sputtering target material is machine-processed, an intermetallic compound falls off to increase a surface area of irregularities, whereby the number of the initial splashes increases. On the other hand, when the upper limit of an amount of Ni exceeds 5 atomic percent, an area fraction of an intermetallic compound having a particle diameter of more than 3 μm increases. Accordingly, when a surface of a sputtering target material is machine-processed, irregularities on a surface become larger to increase in inclusion of non-conductive inclusions such as oxides, resulting in the increase in the number of the initial splashes. The content of Ni is preferably from 0.1 atomic percent to 4 atomic percent, more preferably from 0.2 atomic percent to 3 atomic percent.

Furthermore, the content of La contained in an Al-based alloy of the invention is preferably from 0.10 atomic percent to 1 atomic percent. The range is calculated based on experimental results of examples described below and defined from the viewpoint similar to Ni. When the lower limit of an amount of La is less than 0.10 atomic percent, an area fraction of an intermetallic compound having a particle diameter of less than 0.2 μm becomes larger. Accordingly, when a surface of a sputtering target material is machine-processed, an intermetallic compound falls off to increase a surface area of irregularities, whereby the number of the initial splashes increases. On the other hand, when the upper limit of an amount of La exceeds 1 atomic percent, an area fraction of an intermetallic compound having a particle diameter of more than 2 μm increases. Accordingly, when a surface of a sputtering target material is machine-processed, irregularities on a surface become larger to increase in inclusion of non-conductive inclusions such as oxides, resulting in the increase in the number of the initial splashes. The content of La is preferably from 0.15 atomic percent to 0.8 atomic percent or less, more preferably from 0.2 atomic percent to 0.6 atomic percent.

As shown above, the Al-based alloy used in the invention contains both of Ni and La and a remainder of Al and inevitable impurities. As the inevitable impurities, for instance, elements inevitably mingled in a production process such as Si and Fe can be cited.

In the next place, an intermetallic compound that characterizes the invention (an Al—Ni system intermetallic compound mainly composed of Al and Ni and an Al—La system intermetallic compound mainly composed of Al and La) will be described.

In a sputtering target of the invention, intermetallic compounds (an Al—Ni system intermetallic compound mainly composed of Al and Ni and an Al—La system intermetallic compound mainly composed of Al and La) present in the sputtering target satisfy the following requirements (1) and (2).

(1) Regarding an Al—Ni-system intermetallic compound mainly composed of Al and Ni, a total area of an Al—Ni system intermetallic compound having an average particle diameter of 0.3 µm to 3 µm with respect to a total area of the entire Al—Ni system intermetallic compound is 70% or more in terms of the area fraction.

(2) Regarding an Al—La system intermetallic compound mainly composed of Al and La, a total area of an Al—La system intermetallic compound having an average particle diameter of 0.2 µm to 2 µm with respect to a total area of the entire Al—La system intermetallic compound is 70% or more in terms of the area fraction.

As mentioned above, according to the Al—Ni—La system Al-based alloy sputtering target that is an object of the invention, when an intermetallic compound in a SEM reflection electron image is image analyzed in accordance with a measurement method that will be detailed below, main intermetallic compounds that can be observed are only two kinds of binary intermetallic compounds composed of Al and Ni or Al and La, and a ternary intermetallic compound, which is observed when an Al—Ni—Nd system Al-based alloy sputtering target that has been typically used is observed in accordance with a similar method (in the case of an Al—Ni—La system Al-based alloy sputtering target, a ternary intermetallic compound composed of Al, Ni and La), is hardly present (see FIGS. 2A to 2D).

In the invention, regarding each of the intermetallic compounds, based on experimental results that the initial splashes can be effectively inhibited from occurring by increasing an area fraction (occupation ratio) of the intermetallic compound having a certain average particle diameter within a predetermined range, the area fraction of the intermetallic compound is set as large as possible (in the invention, 70%).

The mechanism of the inhibition of splash generation due to the intermetallic compounds is assumed as follows.

That is, the reason that the initial splash is generated is generally considered that, when a surface of a sputtering target material is machine-processed, an intermetallic compound falls off, whereby a surface area of irregularities is increased. Then, (1) regarding an Al—Ni system intermetallic compound mainly composed of Al and Ni, when an area fraction of an intermetallic compound having an average particle diameter of less than 0.3 µm becomes larger, the generation number of the initial splashes increases, and on the other hand, when an area fraction of an intermetallic compound having an average particle diameter of more than 3 µm becomes larger, it is considered that owing to an increase in surface irregularities due to machine processing, inclusion of nonconductive inclusions such as oxide increases thereby to result in an increase in the generation number of the initial splashes. Such a trend is similarly found as well in (2) an Al—La system intermetallic compound mainly composed of Al and La. That is, when an area fraction of an intermetallic compound having an average particle diameter of less than 0.2 µm becomes larger, the generation number of the initial splashes increases, and on the other hand, when an area fraction of an intermetallic compound having an average particle diameter of more than 2 µm becomes larger, it is considered that owing to an increase in surface irregularities due to machine processing, inclusion of nonconductive inclusions such as oxide increases thereby to result in an increase in the generation number of the initial splashes.

Between the Al—Ni system intermetallic compound and the Al—La system intermetallic compound, the ranges of the average particle diameter that contributes to the inhibition of initial splash generation are a little different from each other. This is assumed because the interface strengths between the intermetallic compounds and an Al matrix are different. That is, the interface strength between the Al—La system intermetallic compound and an Al matrix is stronger than that between the Al—Ni system intermetallic compound and an Al matrix.

In the invention, the occupation ratio of each intermetallic compound having an average particle diameter satisfying the above-mentioned range is set at 70% or more. The larger the occupation ratio is the better. Regarding each of the intermetallic compounds, the occupation ratio is preferably 75% or more and more preferably 80% or more.

A measurement method of a particle size distribution of each of the Al—Ni system intermetallic compound and Al—La system intermetallic compound, which are objects of the invention, is as follows.

In the beginning, a sputtering target containing Ni and La is prepared.

In the next place, a measurement plane of the sputtering target (arbitrary three points from a portion from ¼ t (t: thickness) to ¾ t in a cross section in a vertical direction to a plane (rolling plane normal line direction, ND)] is observed by the use of a SEM provided with EDX (In an example described below, Quanta 200FEG (trade name, produced by Philips Co., Ltd.) or Supra-35 (trade name, produced by Carl Zeiss Co., Ltd.) is used.) at a magnification of 2000 times, and a reflection electron image is taken. The measurement plane is mirror polished in advance. One viewing field size is set to substantially 60 µm×50 µm. A photographed reflection electron image is image analyzed by the use of an analysis system NanoHunter NS2K-Pro (trade name, produced by Nanosystem Corp.), whereby an average particle diameter (circle equivalent diameter) of each of the Al—Ni system intermetallic compound and Al—La system intermetallic compound and the area fraction at which each of the intermetallic compounds having the average particle diameter occupies in an entire intermetallic compound are obtained. Thus, the area fractions in three viewing fields in total are obtained and an average value thereof is taken as the area fraction of each of the intermetallic compounds.

According to the method, the Al—Ni system intermetallic compound and Al—La system intermetallic compound can be readily differentiated via color difference (shading difference). A reflection electron image of the Al—Ni system intermetallic compound is shown white and a reflection electron image of the Al—La system intermetallic compound is shown gray.

Figure 1A:
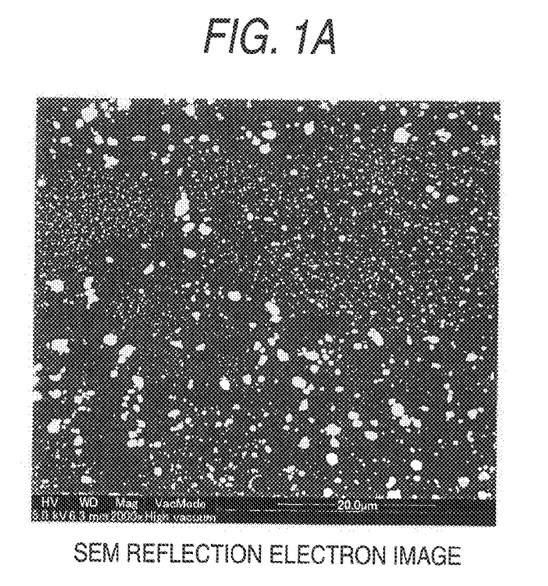
FIG. 1A is a SEM reflection electron image of example No. 5 (inventive example) of Table 1, FIG. 1B being an image analysis result of an Al—La system intermetallic compound in the SEM reflection electron image, and FIG. 1C being an image analysis result of an Al—Ni system intermetallic compound in the SEM reflection electron image.
Figure 1B:
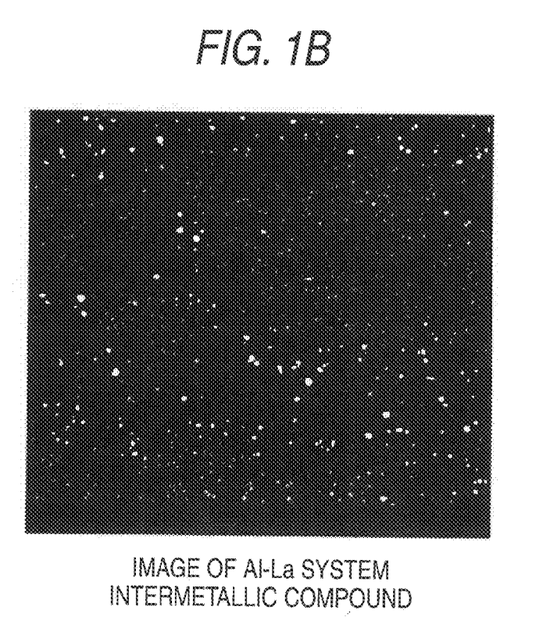
Figure 1C:
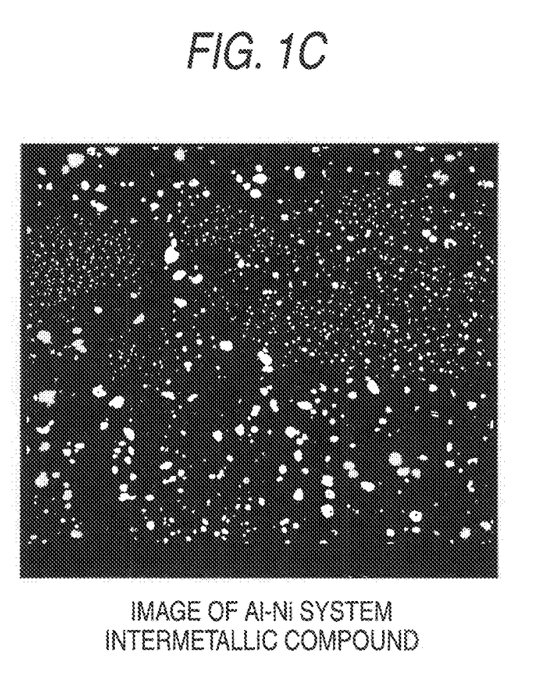

For reference purpose, in FIGS. 1A to 1C, regarding example No. 5 (inventive example) in Table 1 described in examples described below, a SEM reflection electron image obtained according to the method (FIG. 1A), an image analysis result of the Al—La system intermetallic compound (FIG. 1B) and an image analysis result of the Al—Ni system intermetallic compound (FIG. 1C) are shown. As shown in FIGS. 1A to 1C, the reflection electron image of the Al—La system intermetallic compound is shown whiter than the Al—Ni system intermetallic compound.

Furthermore, in FIGS. 2A to 2D, regarding a SEM reflection electron image of example No. 5 (inventive example) same as above, compositions of a matrix (1 in FIG. 2A), a white compound (2, in FIG. 2A) and a gray compound (3, in FIG. 2A) are analyzed with EDX and results thereof are shown. It was confirmed that the matrix 1 is, as shown in FIG. 2B, composed only of Al, the white compound 2 is, as shown in FIG. 2C, composed substantially of Al and La and the grey compound 3 is, as shown in FIG. 2D, composed substantially of Al and Ni.

In the next place, a process for producing a sputtering target of the invention will be described.

Firstly, an Al—Ni—La system Al-based alloy containing 0.05 atomic percent to 5 atomic percent of Ni and 0.10 atomic percent to 1 atomic percent of La is prepared.

In the next place, using the above-mentioned Al-based alloy, an Al-based alloy preform (an intermediate body before obtaining a final dense body) is produced preferably according to a spray forming method, followed by densifying the preform by the use of a densifying means.

Herein, the spray forming method is a method where various kinds of molten metals are atomized with a gas and particles quenched in a semi-molten state/semi-soldification state/solid state are deposited to obtain a preform having a predetermined shape. According to the method, there are various advantages that, in addition that a large preform that is difficult to obtain according to a melt casting method or a powder metallurgy method can be obtained in a single process, grains can be made fine and alloy elements can be uniformly dispersed.

The step of producing a preform includes: melting an Al-based alloy at a temperature substantially in the range of (liquidus temperature+150° C.) to (liquidus temperature+300° C.) to obtain a melt of the Al-based alloy; gas atomizing the melt of the Al-based alloy under the conditions with a gas/metal ratio expressed by a ratio of gas outflow/melt outflow of 6 $Nm^3$/kg or more for miniaturization; and depositing the miniaturized Al-based alloy on a collector under the conditions with a spray distance substantially of 900 to 1200 mm to obtain a preform.

Figure 3:
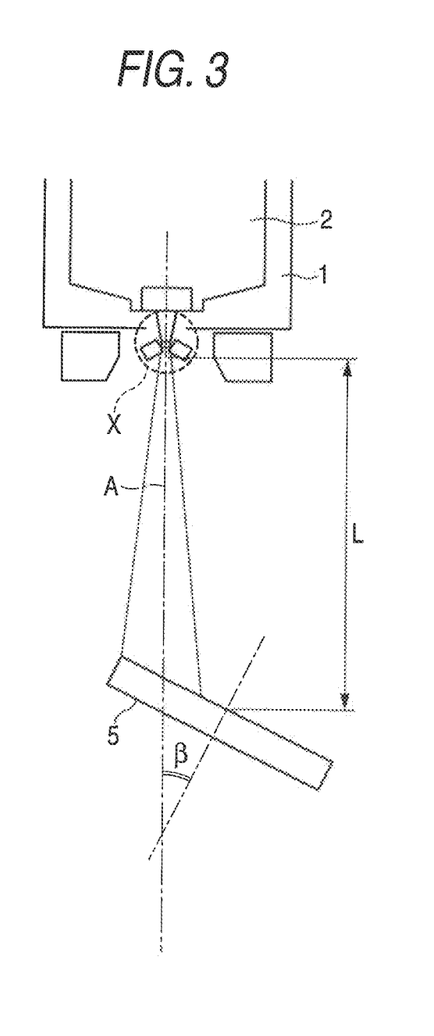
FIG. 3 is a sectional view partially showing an example of a device used to produce a preform.
Figure 4:
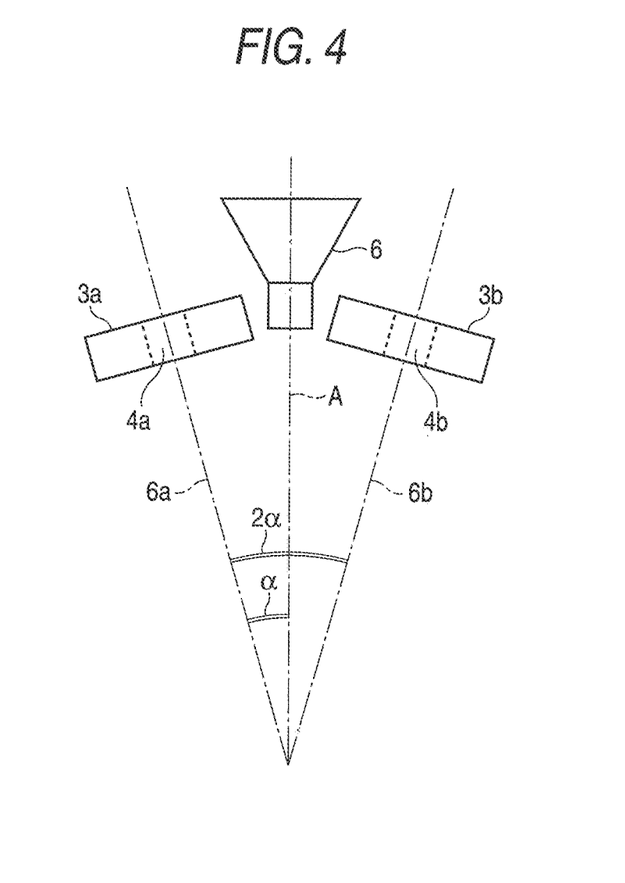
FIG. 4 is an enlarged diagram of an essential part of X in FIG. 3.

In what follows, with reference to FIGS. 3 and 4, the respective steps for obtaining a preform will be detailed.

FIG. 3 is a sectional view partially showing an example of a device used to produce a preform of the invention. FIG. 4 is an enlarged view of as essential part of X in FIG. 3.

A device shown in FIG. 3 includes an induction melting furnace 1 for melting an Al-based alloy; gas atomizers 3a and 3b disposed below the induction melting furnace 1; and a collector 5 for depositing a preform. The induction melting furnace 1 includes a nozzle 6 for dropping a melt 2 of the Al-based alloy. Furthermore, the gas atomizers 3a and 3b, respectively, have gas holes 4a and 4b of bobbins for atomizing a gas. The collector 5 includes driving means (not shown in the drawing) such as a stepping motor.

In the beginning, an Al-based alloy having above-mentioned composition is prepared. The Al-based alloy is put in the induction melting furnace 1, followed by, preferably in an inert gas (for instance, Ar gas) atmosphere, melting at a temperature substantially in the range of +150° C. to +300° C. to a liquidus temperature of the Al-based alloy.

A melting temperature is generally set to a temperature in the range of (liquidus temperature +50° C.) to (liquidus temperature +200° C.) (see, for example JP-A-09-248665). However, in the invention, in order to appropriately control the particle size distributions of the two kinds of intermetallic compounds, the above-mentioned range is set. In the case of the Al—Ni—La system Al-based alloy that is an object of the invention, the melting temperature is set substantially in the range of 800 to 950° C. When the melting temperature is less than 800° C., a nozzle is clogged in the spray forming. On the other hand, when the melting temperature exceeds 950° C., since a liquid drop temperature becomes higher and whereby an area fraction at which an Al—Ni system intermetallic compound having an average particle diameter of 3 μm or more occupies increases, desired splash inhibition effect cannot be obtained (refer to examples described below). The melting temperature of an alloy is preferably in the range of (liquidus temperature +150° C.) to (liquidus temperature +300° C.). In the case of the Al—Ni—La system Al-based alloy that is an object of the invention, the melting temperature is preferably in the range of 800 to 950° C., more preferably in the range of 850 to 950° C.

In the next place, the alloy melt 2 obtained as mentioned above is dropped in a chamber (not shown in the drawing) having an inert atmosphere through a nozzle 6. In the chamber, from gas holes 4a and 4b of bobbins provided to the gas atomizers 3a and 3b, a jet flow of pressurized inert gas is sprayed to the melt 2 of the alloy thereby to miniaturize the alloy melt.

The gas atomization is preferably carried out, as mentioned above, with an inert gas or a nitrogen gas, whereby the melt can be inhibited from oxidizing. As the inert gas, for instance, an argon gas can be cited.

Herein, the gas/metal ratio is set at 6 $Nm^3$/kg or more. The gas/metal ratio is expressed by a ratio of gas outflow ($Nm^3$)/melt outflow (kg). In the specification, the gas outflow means a sum total (finally used amount) of a gas flowed out of the gas holes 4a and 4b of the bobbins for gas atomizing the melt of the Al-based alloy. Furthermore, in the specification, the melt outflow means a sum total of a melt flowed out of a melt outflow port (nozzle 6) of a vessel (induction melt furnace 1) in which the melt of the Al-based alloy is present.

When the gas/metal ratio is less than 6 $Nm^3$/kg, a size of a liquid drop tends to be larger to thereby lower the cooling speed. Accordingly, an occupation ratio of the Al—Ni system intermetallic compound having an average particle diameter of more than 3 μm is increased to thereby result in incapability of obtaining a desired effect (refer to examples described below).

The larger the gas/metal ratio the better. For instance, the gas/metal ratio is preferably 6.5 $Nm^3$/kg or more, more preferably 7 $Nm^3$/kg or more. The upper limit thereof is not particularly restricted. However, from the viewpoints of the stability of liquid drop flow during the gas atomizing and the cost, the upper limit of the gas/metal ratio is preferably set at 15 $Nm^3$/kg, more preferably set at 10 $Nm^3$/kg.

Furthermore, when an angle that center axes 6a and 6b of the opposing gas atomizing nozzles form is expressed by 2α, α is preferably controlled in the range of 1 to 10°. An angle 2α that center axes 6a and 6b of the opposing gas atomizing nozzles form means a total angle of the respective inclinations α of the gas atomizers 4a and 4b relative to a line (corresponding to a spray axis A) when the melt 2 vertically drops. In what follows, the a is called as a "gas atomizer outlet angle α". The gas atomizer outlet angle α is preferably in the range of 1° to 7°.

Subsequently, thus miniaturized Al-based alloy (liquid drops) is deposited on the collector 5 to obtain a preform.

Herein, the spray distance is preferably controlled in the range of 900 to 1200 mm. The spray distance defines a deposition position of a liquid drop and, as shown in FIG. 3, it means a distance L from a tip end of the nozzle 6 to a center of the collector 5.

As will be described below, since the collector 5 tilts at a collector angle β, the spray distance L means, strictly speaking, a distance between the tip end of the nozzle 6 and a point A1 where the center of the collector 5 comes into contact with a spray axis A. Herein, the spray axis A defines, for the sake of convenience of description, a direction along which a liquid drop of the Al-based alloy falls straight.

In general, the spray distance in the spray forming is controlled at substantially 500 mm. However, in the invention, in order to obtain desired particle size distributions of the two kinds of intermetallic compounds, the above-mentioned range is adopted (refer to examples described below). When the spray distance is less than 900 mm, liquid drops in a high temperature state are deposited to make the cooling speed slower. Accordingly, an occupation ratio of an Al—Ni system intermetallic compound having an average particle diameter of 3 μm or more increases to thereby result in incapability of obtaining a desired effect. On the other hand, when the spray distance exceeds 1200 mm, the yield is deteriorated. The spray distance is preferably substantially in the range of 950 to 1100 mm.

Furthermore, the collector angle β is preferably controlled in the range of 20 to 45°. The collector angle β means, as shown in FIG. 3, an inclination of the collector 5 to the spray axis A.

In the above, a preferable method for obtaining the preform was described.

According to a standard method that thus obtained preform of Al-based alloy is densified by the use of a densifying means to obtain a dense body, followed by applying plastic working to the dense body, a sputtering target can be produced.

In the beginning, by applying the densifying means to the preform, an Al-based alloy dense body is obtained. As the densifying means, a method of pressurizing a preform in a substantially equal pressure direction, in particular, a hot isostatic pressing (HIP) where pressure is applied under heating, is preferably applied. Specifically, the HIP treatment is applied preferably, for instance, under pressure of 80 MPa or more and at a temperature in the range of 400 to 600° C. The period for HIP treatment is preferably substantially in the range of 1 to 10 hours.

Then, the Al-based alloy dense body is forged to obtain a slab.

The forging condition is not particularly restricted so long as a method that is usually used to produce a sputtering target is used. However, the forging is preferably applied after an Al-based alloy dense body before forging is heated at a temperature of substantially 500° C. for substantially 1 to 3 hours.

To the slab thus obtained as mentioned above, a rolling process is applied under the conditions with a rolling temperature of 300 to 550° C. and a total rolling reduction of 40 to 90%. As will be shown in examples described below, in the invention, the rolling conditions have to be controlled delicately as mentioned above. When the rolling is applied under conditions where any one of the conditions is outside the range, desired crystallographic orientations cannot be obtained.

Herein, the total rolling reduction is expressed by the following formula.

Total rolling reduction (%)={(thickness before rolling)−(thickness after rolling)}/(thickness before rolling)×100

The Al-based alloy produced by the spray forming method, being difficult to cause a change in a structure during the processing, can be produced according to either one of the cold rolling and hot rolling. However, in order to heighten the processing rate per one pass, an Al-based alloy material can be effectively heated and processed in a temperature range low in the deformation resistance; accordingly, the hot rolling is preferably adopted.

In the next place, a heating process (heat treatment or annealing) is applied at a temperature in the range of 250 to 500° C. for 0.5 to 4 hours. An atmosphere during the heating process, without particularly restricting, may be any one of air, inert gas and vacuum. However, in view of the productivity and cost, heating in air is preferred.

When a machining process is applied into a predetermined shape after the heat treatment, a desired sputtering target can be obtained.

EXAMPLES

Hereinafter, with reference to examples, the invention will be more specifically described. However, the invention is not restricted to or by the examples below, and can be carried out by appropriately modifying within a range that can adapt to the gist of the invention and all these are contained in the technical range of the invention.

Example 1

With Al-based alloys having various compositions shown in table 1, according to the following spray forming method, Al-based alloy preforms (density: substantially 50 to 60%) were obtained.

(Spray Forming Conditions)
Melting temperature: 750 to 1100° C. (refer to Table 1)
Gas/metal ratio: 5 to 7 Nm³/kg (refer to Table 1)
Spray distance: 800 to 1300 mm
Gas atomizer outlet angle (α): 7°
Collector angle (β): 35°

Thus obtained preform was sealed in a capsule, followed by deaerating, further followed by applying a hot isostatic pressing (HIP) to an entirety of the capsule, whereby an Al—Ni—La system Al-based alloy dense body was obtained. The HIP process was carried out at a HIP temperature of 550° C., under a HIP pressure of 85 MPa for the HIP time of 2 hours.

Thus obtained dense body was forged into a slub metal material, followed by rolling so that a plate thickness may be substantially same as that of a final product (target), further followed by annealing and mechanically processing (corner cutting work and turning work), whereby a disc-shaped Al-(0.02-5.5 at %) Ni-(0.05-1.5 at %) La system Al-based alloy sputtering target (size: diameter, 101.6 mm×thickness 5.0 mm) was produced. Detailed conditions are as follows.

Heating conditions before forging: 500° C. for 2 hours
Heating conditions before rolling: 400° C. for 2 hours
Total rolling reduction: 50%
Annealing conditions: 400° C. for 1 hour In the next place, using each of the sputtering targets obtained according to the above-mentioned method, the number of splashes (initial splash) occurring when the sputtering is carried out under the following conditions was measured.

Figure 6:
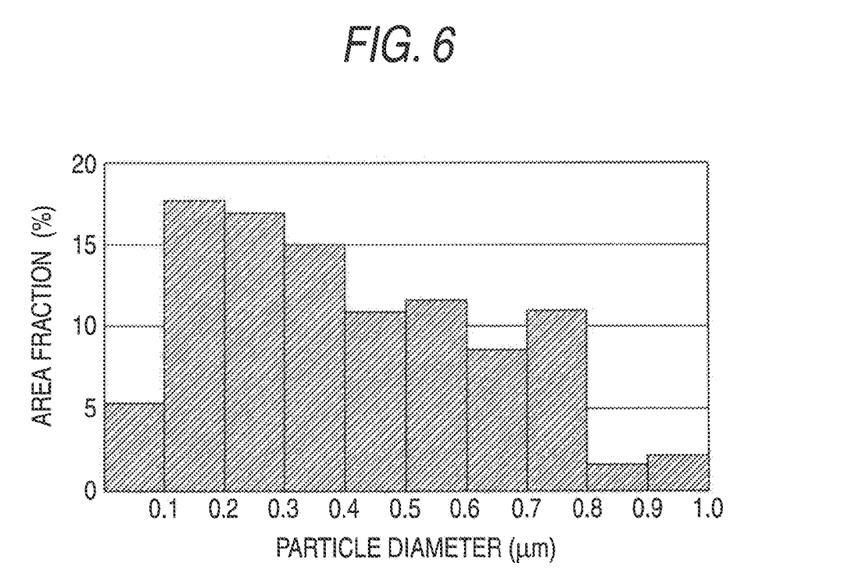
FIG. 6 is a graph showing a particle size distribution of an Al—La system intermetallic compound in example No. 5 (inventive example) of Table 1.

Firstly, to a Si wafer substrate (size: diameter 100.0 mm×thickness 0.50 mm), DC magnetron sputtering was carried out by the use of a sputtering device, "Sputtering System HSM-542S" (trade name, produced by Shimadzu Corp.). The sputtering conditions were as follows.

particle size distribution of an Al—La system intermetallic compound is shown in FIG. 6. In FIG. 6, for convenience sake, only a particle size distribution up to 1.0 μm in particle size is shown. However, particles having a size exceeding 1.0 μm in particle size were not at all found.

TABLE 1

| | | | | | | Area flaction of intermetallic compound (%) | | Initial splash | |
|---|---|---|---|---|---|---|---|---|---|
| No. | Ni content (atomic percent) | La content (atomic percent) | Melting temperature (° C.) | Gas/metal ratio (Nm³/kg) | Spray distance (mm) | Al—Ni system intermetallic compound having a size of 0.3 to 3 μm | Al—La system intermetallic compound having a size of 0.2 to 2 μm | Occurrence frequency (number/cm²) | Judgment |
| 1 | 0.02 | 0.35 | 950 | 7 | 1000 | 69.2 | 90.2 | 18 | B |
| 2 | 0.05 | 0.35 | 950 | 7 | 1000 | 98.9 | 93.3 | 2 | A |
| 3 | 0.30 | 0.35 | 950 | 7 | 1000 | 98.8 | 87.9 | 6 | A |
| 4 | 1 | 0.35 | 950 | 7 | 1000 | 99.4 | 91.1 | 4 | A |
| 5 | 2 | 0.35 | 950 | 7 | 1000 | 86.9 | 76.6 | 7 | A |
| 6 | 5 | 0.35 | 950 | 7 | 1000 | 96.0 | 91.1 | 3 | A |
| 7 | 5.5 | 0.35 | 950 | 7 | 1000 | 68.1 | 82.5 | 30 | B |
| 8 | 2 | 0.05 | 950 | 7 | 1000 | 90.4 | 66.8 | 23 | B |
| 9 | 2 | 0.10 | 950 | 7 | 1000 | 90.5 | 79.2 | 7 | A |
| 10 | 2 | 0.50 | 950 | 7 | 1000 | 95.9 | 88.3 | 6 | A |
| 11 | 2 | 1.00 | 950 | 7 | 1000 | 95.3 | 85.2 | 5 | A |
| 12 | 2 | 1.50 | 950 | 7 | 1000 | 91.3 | 68.7 | 16 | B |
| 13 | 2 | 0.35 | 750 | 7 | 1000 | — | — | — | — |
| 14 | 2 | 0.35 | 800 | 7 | 1000 | 82.1 | 73.0 | 7 | A |
| 15 | 2 | 0.35 | 880 | 7 | 1000 | 85.1 | 75.2 | 6 | A |
| 16 | 2 | 0.35 | 1100 | 7 | 1000 | 68.9 | 93.5 | 13 | B |
| 17 | 5 | 0.50 | 950 | 5 | 1000 | 65.3 | 94.2 | 19 | B |
| 18 | 5 | 0.50 | 950 | 6 | 1000 | 75.2 | 90.1 | 7 | A |
| 19 | 5 | 0.50 | 950 | 7 | 800 | 64.5 | 93.8 | 21 | B |
| 20 | 5 | 0.50 | 950 | 7 | 900 | 83.2 | 94.2 | 6 | A |
| 21 | 5 | 0.50 | 950 | 7 | 1000 | 86.7 | 94.5 | 5 | A |
| 22 | 5 | 0.50 | 950 | 7 | 1200 | 93.5 | 95.1 | 3 | A |
| 23 | 5 | 0.50 | 950 | 7 | 1300 | — | — | — | — |

Backpressure: $3.0 \times 10^{-6}$ Torr or less, Ar gas pressure: $2.25 \times 10^{-3}$ Torr, Ar gas flow rate: 30 sccm, sputtering power: 811 W, polar distance: 51.6 mm, substrate temperature: room temperature Thus, with regard to one sputtering target, 16 thin films (thickness: 0.2 mm) were formed.

In the next place, by the use of a particle counter (trade name: Wafer Surface Detector WM-3, produced by Topcon Corp.), positional coordinates, sizes (average particle diameter) and number of particles found on a surface of the thin film were measured. Here, one of which size is 3 μm or more is regarded as a particle.

Thereafter, the thin film surface was observed with an optical microscope (magnification: 1000 times) and, with one of which shape is semispherical being regarded as splash, the number of splashes per unit area was measured.

In detail, a step of carrying out the sputtering of one thin film was continuously repeated 16 times similarly with a Si wafer substrate exchanging each time, and an average value of the numbers of the splashes was taken as "occurrence frequency of initial splashes". In the present examples, one of which occurrence frequency of initial splashes is less than 8 spots/cm² is taken as "effective in reducing the initial splashes: acceptable (A)" and one of which occurrence frequency of initial splashes is 8 spots/cm² or more was taken as "ineffective in reducing the initial splashes: unacceptable (B)".

Figure 5:
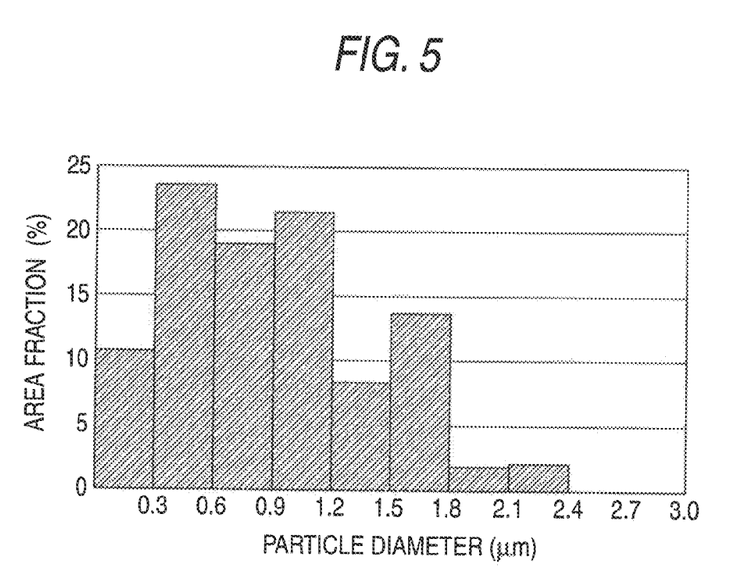
FIG. 5 is a graph showing a particle size distribution of an Al—Ni system intermetallic compound in example No. 5 (inventive example) of Table 1.

The results thereof are shown together in Table 1. For the purpose of reference, regarding example No. 5 (inventive example) of Table 1, a particle size distribution of an Al—Ni system intermetallic compound is shown in FIG. 5 and a From Table 1, considerations can be made as follows.

In example Nos. 2 through 6, 9 through 11, 14 through 15, 18 and 20 through 22, particle size distributions of the Al—Ni system intermetallic compound and Al—La system intermetallic compound are appropriately controlled. Accordingly, the initial splash reduction effect is excellent.

On the other hand, comparative examples where the intermetallic compounds do not satisfy the requirements of the invention on the particle size distribution could not effectively inhibit the splash from occurring, due to reasons described below.

Example No. 1 is an example where an Al-based alloy containing less Ni is used and example No. 7 is an example where an Al-based alloy containing much Ni is used. In each thereof, the total area fraction of the Al—Ni system intermetallic compound that contributes to the inhibition of splash generation was slight.

Example No. 8 is an example where an Al-based alloy containing less La is used and example No. 12 is an example where an Al-based alloy containing much La is used. In each thereof, the total area fraction of the Al—La intermetallic compound that contributes to the inhibition of splash generation was slight.

Example No. 13 is an example produced at a low melting temperature. Since the nozzle was clogged in the spray forming, an electron microscope observation and image analysis following thereafter could not be applied.

Example No. 16 is an example produced at a high melting temperature. The total area fraction of the Al—Ni system intermetallic compound that contributes to the inhibition of splash generation was slight.

Example No. 17 is an example produced by setting a gas/metal ratio low. The total area fraction of the Al—Ni system intermetallic compound that contributes to the inhibition of splash generation was slight.

Example No. 19 is an example produced by setting a spray distance shorter. The total area fraction of the Al—Ni system intermetallic compound that contributes to inhibition of splash generation was slight.

Example No. 23 is an example produced by setting the spray distance longer. Since the yield was lowered in the spray forming, an electron microscope observation and image analysis following thereafter could not be applied.

While the present invention has been described in detail and with reference to specific embodiments thereof, it will be apparent to one skilled in the art that various changes and modifications can be made therein without departing from the scope thereof.

This application is based on Japanese patent application No. 2006-313506 filed Nov. 20, 2006, the entire contents thereof being hereby incorporated by reference.

Further, all references cited herein are incorporated in their entireties.

What is claimed is:

1. An Al—Ni—La system Al-based alloy sputtering target comprising Ni and La,
wherein, when a section from (¼)t to (¾)t (t: thickness of the sputtering target) in a cross section vertical to a plane of the sputtering target is observed with a scanning electron microscope at a magnification of 2000 times,
   (1) a total area of an Al—Ni system intermetallic compound having an average particle diameter of 0.3 μm to 3 μm with respect to a total area of the entire Al—Ni system intermetallic compound is 70% or more in terms of an area fraction, the Al—Ni system intermetallic compound being mainly composed of Al and Ni; and
   (2) a total area of an Al—La system intermetallic compound having an average particle diameter of 0.2 μm to 2 μm with respect to a total area of the entire Al—La system intermetallic compound is 70% or more in terms of an area fraction, the Al—La system intermetallic compound being mainly composed of Al and La.

2. The Al—Ni—La system Al-based alloy sputtering target according to claim 1, which comprises:
Ni in an amount of 0.05 atomic percent to 5 atomic percent; and
La in an amount of 0.10 atomic percent to 1 atomic percent.

3. The Al—Ni—La system Al-based alloy sputtering target according to claim 1, which comprises:
Ni in an amount of 0.1 atomic percent to 4 atomic percent; and
La in an amount of 0.2 atomic percent to 0.8 atomic percent.

4. The Al—Ni—La system Al-based alloy sputtering target according to claim 1, which comprises:
Ni in an amount of 0.2 atomic percent to 3 atomic percent; and
La in an amount of 0.2 atomic percent to 0.6 atomic percent.

5. The Al—Ni—La system Al-based alloy sputtering target according to claim 1, wherein the total area of an The Al—Ni system intermetallic compound having an average particle diameter of 0.3 μm to 3 μm with respect to a total area of the entire The Al—Ni system intermetallic compound is 75% or more in terms of an area fraction.

6. The Al—Ni—La system Al-based alloy sputtering target according to claim 1, wherein the total area of an The Al—Ni system intermetallic compound having an average particle diameter of 0.3 μm to 3 μm with respect to a total area of the entire The Al—Ni system intermetallic compound is 80% or more in terms of an area fraction.

7. The Al—Ni—La system Al-based alloy sputtering target according to claim 1, wherein the total area of an The Al—Ni system intermetallic compound having an average particle diameter of 0.3 μm to 3 μm with respect to a total area of the entire The Al—Ni system intermetallic compound is 82.1% or more in terms of an area fraction.

8. The Al—Ni—La system Al-based alloy sputtering target according to claim 1, wherein the total area of an The Al—Ni system intermetallic compound having an average particle diameter of 0.3 μm to 3 μm with respect to a total area of the entire The Al—Ni system intermetallic compound is 85.2% or more in terms of an area fraction.

9. The Al—Ni—La system Al-based alloy sputtering target according to claim 1, wherein the total area of an The Al—Ni system intermetallic compound having an average particle diameter of 0.3 μm to 3 μm with respect to a total area of the entire The Al—Ni system intermetallic compound is 83.2% or more in terms of an area fraction.

10. The Al—Ni—La system Al-based alloy sputtering target according to claim 1, wherein the total area of an The Al—Ni system intermetallic compound having an average particle diameter of 0.3 μm to 3 μm with respect to a total area of the entire The Al—Ni system intermetallic compound is 94.2% or more in terms of an area fraction.

11. The Al—Ni—La system Al-based alloy sputtering target according to claim 1, wherein the total area of an Al—La system intermetallic compound having an average particle diameter of 0.2 μm to 2 μm with respect to a total area of the entire Al—La system intermetallic compound is 75% or more in terms of an area fraction.

12. The Al—Ni—La system Al-based alloy sputtering target according to claim 1, wherein the total area of an The Al—La system intermetallic compound having an average particle diameter of 0.2 μm to 2 μm with respect to a total area of the entire The Al—La system intermetallic compound is 80% or more in terms of an area fraction.

13. The Al—Ni—La system Al-based alloy sputtering target according to claim 1, wherein the total area of an The Al—La system intermetallic compound having an average particle diameter of 0.2 μm to 2 μm with respect to a total area of the entire The Al—La system intermetallic compound is 82.5% or more in terms of an area fraction.

14. The Al—Ni—La system Al-based alloy sputtering target according to claim 1, wherein the total area of an The Al—La system intermetallic compound having an average particle diameter of 0.2 μm to 2 μm with respect to a total area of the entire The Al—La system intermetallic compound is 85.2% or more in terms of an area fraction.

15. The Al—Ni—La system Al-based alloy sputtering target according to claim 1, wherein the total area of an The Al—La system intermetallic compound having an average particle diameter of 0.2 μm to 2 μm with respect to a total area of the entire The Al—La system intermetallic compound is 90.1% or more in terms of an area fraction.

16. The Al—Ni—La system Al-based alloy sputtering target according to claim 1, wherein the total area of an The Al—La system intermetallic compound having an average particle diameter of 0.2 μm to 2 μm with respect to a total area of the entire The Al—La system intermetallic compound is 95.1% or more in terms of an area fraction.

* * * * *